United States Patent [19]

Bakker

[11] 3,752,899

[45] Aug. 14, 1973

[54] SHIELDING AND GASKETING MATERIAL

[75] Inventor: Willem F. Bakker, Piscataway, N.J.

[73] Assignee: Metex Corporation, Edison, N.J.

[22] Filed: May 25, 1970

[21] Appl. No.: 40,329

[52] U.S. Cl. ............ 174/35 GC, 161/164, 277/228, 277/235

[51] Int. Cl. ............ H05k 9/00

[58] Field of Search ............ 161/164; 174/35 GC, 174/35 R, 35 MS; 277/235 R, 234, 228

[56] References Cited

UNITED STATES PATENTS 2,454,567 11/1948 Pierson ............ 174/35 GC

*Primary Examiner*—Morris Sussman
*Attorney*—Bierman and Bierman

[57] ABSTRACT

An elastomeric matrix has an upper face and a lower face. Preferably a plurality of continuous unitary conductive layers is disposed within the matrix perpendicular to said face. A plurality of contact points are in contact with the conductive layer. The conductive layer is preferably expanded metal.

12 Claims, 5 Drawing Figures

INVENTOR.
WILLEM F. BAKKER
BY Bierman & Bierman
ATTORNEYS

Patented Aug. 14, 1973 3,752,899

2 Sheets-Sheet 2

INVENTOR.
WILLEM F. BAKKER
BY Berman & Berman
ATTORNEYS

SHIELDING AND GASKETING MATERIAL

This invention relates to a gasketing and shielding material, and to a method of making same.

More particularly, this invention relates to a composite EMI shielding and gasketing strip material. The material is designed for low frequency magnetic field shielding. It is also outstanding as an electric field and plane wave shielding.

Delicate electronic equipment must often be shielded from external sources of electromagnetic radiation. This can be accomplished by placing either the sensitive equipment or the radiation source into a chamber designed to prevent escape of undesired electromagnetic radiation therefrom. The chamber must, however, have a door or entry port to permit access to the enclosed equipment. Access is necessary to permit, for example, observation, adjustment or repair of the equipment.

Such chambers suffer from a major disadvantage. Leakage of offending electromagnetic radiation occurs between the edge of the chamber door or entry port and the chamber body. The gasketing and shielding material of the instant invention is intended to overcome this defect.

It is an object of this invention to provide a gasketing and shielding material which can be utilized as gasketing between the edge of the chamber door or entry port and the chamber body. Multiple contact points on the upper and lower faces of the material are provided. These points are in electrical contact with both the door and the chamber body, the door and chamber body being grounded. Leakage of electromagnetic radiation is thereby prevented.

Figure 1:
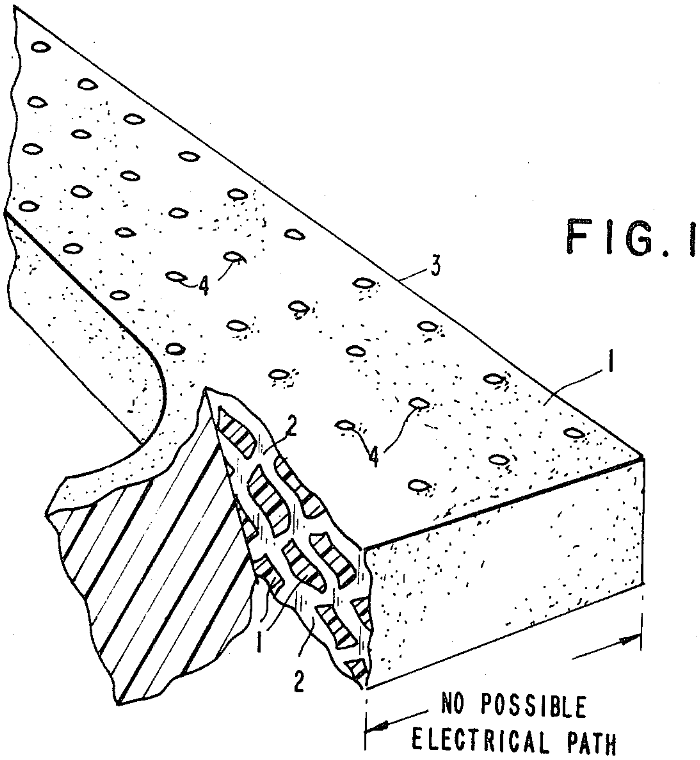
Figure 2:
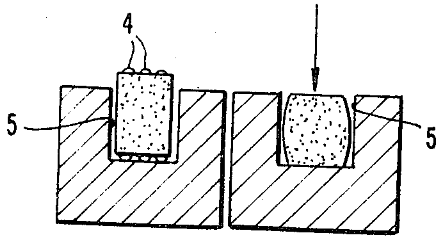
Figure 5:
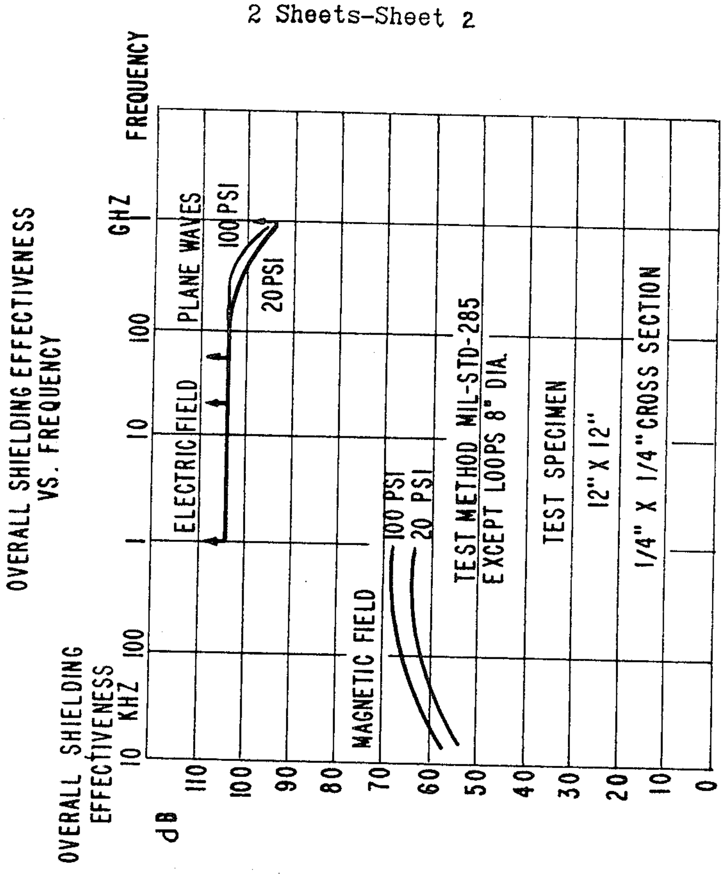
Figure 3:
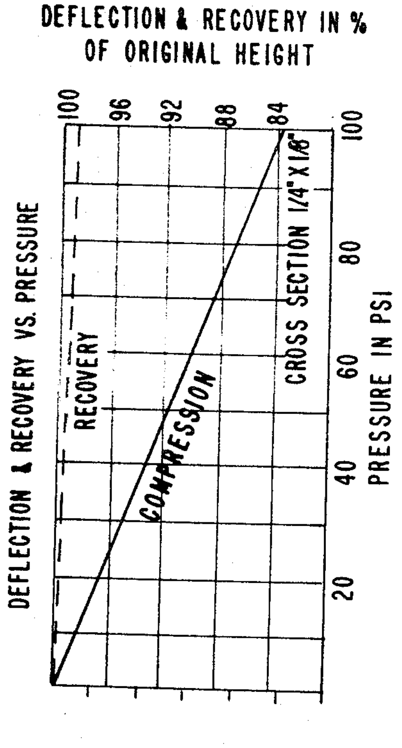
Figure 4:
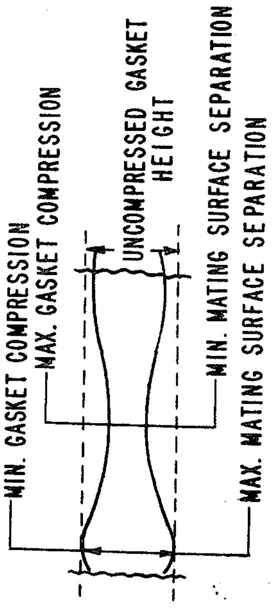

The material of the present invention will now be explained with reference to the accompanying drawings wherein FIG. 1 is a perspective view partly in section of the material of the present invention, FIG. 2 illustrates the allowance for lateral deformation, FIG. 3 shows typical compression and return characteristics of a rectangular cross section of the strip material of the present invention, FIG. 4 illustrates the relationship between gasket compression and joint uneveness, and FIG. 5 illustrates the shielding performance of the material of the present invention.

As is shown in FIG. 1, the material of the instant invention is comprised of a non-conductive matrix 1. The matrix may be comprised of an elastomeric material. Silicone rubber is preferred. A pressure sealing silicon rubber is particularly preferred. A solid silicon rubber per MIL-R-5847 and 22-R-765 (color gray) having a temperature range of −70° F to 380°F may be utilized. At least one continuous layer of a conductive material 2 is disposed within the matrix 1. A plurality of contact points 4 are disposed on the upper face 3 and the lower face (not shown) of the material of the instant invention. Contact points 4 are in contact with the layer of conductive material 2.

The contact points are preferably coated to assure maximum conductivity and maximum protection against corrosion. The coating can be applied by electroplating. Alternatively, the material of the present invention can be immersed into molten contact coating material and withdrawn rapidly. The elastomer will withstand the high temperatures encountered during the short immersion period and the contact coating material will adhere only to the contact points 4. The contact coating material is preferably a metal or metal alloy affording low contact resistance (high contact conductivity) to mating surfaces (the door and the chamber body). A tin alloy is preferred since it is closer to the electrochemical potential of most mating surfaces than to other EMI gasketing materials.

The material of the instant invention may conveniently be produced in strips or as fabricated gaskets to suit particular specifications. For particularly difficult pressure sealing problems a strip gasket material with the conductive paths molded into only one edge of the strip is recommended. When mounting the strips or gaskets, an allowance of 5 to 10 percent additional volume should be made for lateral deformation of the elastomer as is shown in FIG. 2. When in strip form, the material is conveniently held in place in slots 5 provided in the chamber body. Alternatively, the strips can be bonded to one mating surface by employing adhesive only on the non-conductive portion 6. Fabricated gaskets are generally bolted in position. The mechanical characteristics of the material of the present invention are illustrated by FIG. 3. FIG. 4 shows typical compression and return characteristics of a rectangular cross section of the strip material of the present invention. The material of the present invention maintains pressure tightness up to 250 lbs. per square inch and higher under special conditions in properly designed joints. Typical closure forces should provide up to 100 lbs. per square inch of gasket area. In some cases, however, as little as 20 lbs. per square inch will provide adequate EMI characteristics, and may also provide adequate pressure sealing. The force required must be sufficient to compress the material of the present invention enough to compensate for total joint unevenness. Joint unevenness is defined as the difference of minimum and maximum separation incluidng distortions due to compression forces. The amount the material of the instant invention is compressed (difference of uncompressed and compressed heights) will be greater than the joint unevenness because the material must make contact at the point of maximum separation between mating surfaces. The relationship between gasket compression and joint unevenness is illustrated in FIG. 4. Gasket height should be four to six times total joint unevenness. To obtain both an EMI and a pressure seal, the material of the instant invention must be compressed, preferably with at least 20 lbs. per square inch, until it makes full contact even at the point of maximum separation between mating surfaces. The compression characteristics of the material are such that in typical application it will be compressed down to as much as 75 percent of its original height. In other words, it is compressed 25 percent of its original height. The amount which the material is compressed should be greater than the total joint unevenness or, using the figures of the immediately preceding example, greater than 25 percent of the gasket height. Thus, the gasket height will be four times joint unevenness. Similarly, the gasket height will be six times joint unevenness if it is compressed 17 percent.

Referring again to FIG. 1, at least one continuous layer of conductive material 2 is disposed within matrix 1. The conductive material may be comprised of copper, preferably a tin-plated copper. In FIG. 1, the silicone matrix is partially peeled away to reveal the continuous conductive layer 2. The conductive layer 2 has the appearance of a wire mesh. Basically, each layer of conductive material is unitary, that is to say, there are no discontinuities. Preferably, each layer of conductive material 2 is comprised of expanded metal. The expanded metal layer 2 may be compressed so as to form corrugations. Layer 2 provides a conductive path through the non-conductive matrix. As is seen in FIG. 1, the layers of expanded metal sheet material are separated from one another by the non-conductive elastomeric material comprising the matrix. Thus there is no possible electrical path between said layers. In other words, there are no transverse conductive paths across the width of the material of the present invention, therefore the conductive elements cannot possibly become unintentional RF leakage paths. The tips of the expanded metal sheet material protrude above the surface of the elastomeric matrix on the upper face 3 and the lower face (not shown) of the material of the present invention. These tips form the contact points 4. Since the conductive paths are solid and continuous, the possibility of a metal chip, wire, or a conductive sphere falling out is eliminated. This is an obvious advantage. The continuous solid current paths extend not only through the upper and lower faces of the gasket material but along its entire length. This provides an internal conductivity which is vastly superior to prior art RFI/EMI gasketing materials. The shielding performance of the material of the present invention is shown in FIG. 5. The marked improvement of the material of the present invention in magnetic field shielding is abundantly clear and offers an important advance in the state of the art. The material of the present invention, because of its very high RF performance, is especially suitable for low frequency H (magnetic) fields. The excellent contact conductivity of the material of the present invention means that closing forces high enough for pressure sealing will almost always provide the required EMI shielding. There is one exception to this rule—the closing force required to achieve maximum shielding for low frequency H field in a joint with small joint unevenness may exceed the closing force required for pressure sealing.

The shielding and gasketing material of the present invention is readily prepared as follows:

A continuous layer of conductive material such as expanded metal is placed within a mold. A non-conductive elastomeric matrix melt is poured into the mold to encase the conductive material. The matrix encased material is permitted to cool, thereby forming a slab. Slices are then cut from the slab. The faces of each slice exposed by the cutting action show a plurality of contact points. The contact points lie substantially in the plane of the exposed face. The contact points represent exposed portions of the continuous layer of conductive material disposed within the non-conductive elastomeric matrix. The slice is then dropped into molten contact coating material as, for example, a molten metal or metal alloy. It must be withdrawn rapidly so as to prevent melting the silicon of the non-conductive elastomeric matrix material. Upon dipping the contact coating material adheres only to the exposed contact points and forms on the exposed faces a plurality of raised contact points or protuberances. Alternatively, as stated heretofore, a contact point coating material can be applied to the contact points by electroplating.

What is claimed is:

1. A shielding and gasketing material for insertion between two electrically conductive mating surfaces, comprising an electrically non-conductive elastomeric matrix having an upper face and a lower face for contact between said electrically conductive mating surfaces, a plurality of compressible electrically conductive layers disposed within said matrix in a plane substantially perpendicular to each of said upper face and said lower face, each electrically conductive layer being electrically isolated in the matrix from each other conductive layer by the said matrix, each said conductive layer having a plurality of contact points exposed on each of said faces adapted for electrical contact with said mating surfaces, said contact points each being coated with a metal or metal alloy, there being electrical conduction only along each said conductive layer while no conductive path exists between adjacent conductive layers.

2. The material as claimed in claim 1 wherin said conductive layers are of expanded metal.

3. The material as described in claim 1 wherein said contact points are coated with a tin alloy.

4. The material as described in claim 2 wherein said metal is copper.

5. The material as described in claim 2 wherein said coating is tin-plated copper.

6. The material as described in claim 1 wherein said elastomeric material is a silicone.

7. A method for producing a shielding and gasketing material comprising the step of encasing a plurality of parallel electrically conductive layers in a non-conductive elastomeric matrix to form a slab, maintaining said matrix between said layers to prevent conduction from occurring between said layers in said matrix, cutting a slice having a first and a second exposed face from the slab so that the encased conductive layers lie in a plane substantially perpendicular to the first exposed face and the second exposed face, the height of the slab forming the width of the slice, portions of the encased conductive layer within the slice forming a plurality of contact points on said exposed faces, said contact points lying substantially in the plane of the exposed faces, and coating the contact points with a metal or metal alloy to produce a plurality of raised contact points on said exposed faces.

8. The method as described in claim 7 wherein the coating step is carried out by dipping the slice into a melt of said metal or metal alloy.

9. The method as described in claim 7 wherein the coating step is carried out by electroplating the metal or metal alloy into said contact points.

10. The method as described in claim 7 wherein a plurality of said continuous unitary conductive layers are separately encased within the matrix, there being no electrical path between said layers.

11. The method as described in claim 7 wherein the conductive layers are made of copper and the contact coating step comprises coating tin on said copper contacts.

12. The method as described in claim 7 wherein each of said electrically conductive layers are continuous unitary conductive layers.

* * * * *